(12) United States Patent
Harada et al.

(10) Patent No.: US 8,529,695 B2
(45) Date of Patent: Sep. 10, 2013

(54) METHOD FOR MANUFACTURING A SILICON WAFER

(75) Inventors: Kazuhiro Harada, Tokyo (JP); Hisashi Furuya, Tokyo (JP)

(73) Assignee: Sumco Corporation, Tokyo (JP)

( * ) Notice: Subject to any disclaimer, the term of this patent is extended or adjusted under 35 U.S.C. 154(b) by 329 days.

(21) Appl. No.: 13/097,116

(22) Filed: Apr. 29, 2011

(65) Prior Publication Data

US 2011/0259259 A1 Oct. 27, 2011

Related U.S. Application Data

(62) Division of application No. 09/718,659, filed on Nov. 22, 2000, now abandoned.

(51) Int. Cl.
*C30B 13/02* (2006.01)

(52) U.S. Cl.
USPC ............... 117/13; 117/15; 117/18; 117/20; 117/932

(58) Field of Classification Search
USPC .................................. 117/13, 15, 18, 20, 932
See application file for complete search history.

(56) References Cited

U.S. PATENT DOCUMENTS

| | | | |
|---|---|---|---|
| 4,200,621 A | 4/1980 | Liaw et al. | |
| 4,608,095 A | 8/1986 | Hill | |
| 5,110,404 A | 5/1992 | Fusegawa et al. | |
| 5,306,939 A | 4/1994 | Mitani et al. | |
| 5,327,007 A | 7/1994 | Imura et al. | |
| 5,449,532 A | 9/1995 | Toyokawa | |
| 5,539,245 A | 7/1996 | Imura et al. | |
| 5,712,198 A | 1/1998 | Shive et al. | |
| 5,919,302 A | 7/1999 | Falster et al. | |
| 5,994,761 A | 11/1999 | Falster et al. | |
| 6,045,610 A | 4/2000 | Park et al. | |
| 6,048,395 A | 4/2000 | Iida et al. | |
| 6,428,619 B1 | 8/2002 | Koya et al. | |

FOREIGN PATENT DOCUMENTS

| | | |
|---|---|---|
| DE | 29 29 089 | 1/1980 |
| DE | 38 04 069 | 8/1989 |
| DE | 195 29 518 | 2/1996 |
| DE | 690 22 269 | 5/1996 |
| DE | 198 06 045 | 8/1998 |

(Continued)

OTHER PUBLICATIONS

U.S. Appl. No. 09/718,659 to Kazuhiro Harada, which was filed Nov. 22, 2000.

(Continued)

*Primary Examiner* — Bob M Kunemund
(74) *Attorney, Agent, or Firm* — Greenblum & Bernstein, P.L.C.

(57) ABSTRACT

Silicon wafer manufacturing method including cleaning polycrystalline silicon with dissolved ozone aqueous solution, cleaning the polycrystalline silicon with fluoric acid or mixed acid of fluoric acid and nitric acid, rinsing the polycrystalline silicon with ultra pure water, melting the rinsed polycrystalline silicon and pulling a single crystal silicon ingot from the molten silicon liquid at a solidification ratio of 0.9 or less, making the pulled single crystal silicon ingot into block-shaped or grain-shaped single crystal silicon, cleaning with dissolved ozone aqueous solution, cleaning with fluoric acid or mixed acid of fluoric acid and nitric acid, rinsing the single crystal silicon with ultra pure water, remelting and pulling a single crystal silicon ingot at a solidification of 0.9 or less, and forming a silicon wafer out of the single crystal silicon ingot.

1 Claim, 11 Drawing Sheets

(56) References Cited

FOREIGN PATENT DOCUMENTS

| JP | 5-144824 | | | 6/1993 |
|----|----------|---|---|--------|
| JP | 7-86289 | | | 3/1995 |
| JP | 11-1393 | | | 1/1999 |
| JP | 2000-86393 | | | 3/2000 |
| JP | 02000306916 | A | * | 11/2000 |
| JP | 02000306919 | | * | 11/2000 |
| WO | 98/45507 | A1 | | 10/1998 |
| WO | 98/45508 | A1 | | 10/1998 |
| WO | 01/21861 | A1 | | 3/2001 |

OTHER PUBLICATIONS

U.S. Appl. No. 13/097,116 to Kazuhiro Harada et al., which was filed Apr. 29, 2011.

Machine English Translation of Japanese publication 11-1393 provided by JPO website, retrieval date of Oct. 27, 2010.

English Translation of Japanese publication 11-1393 provided by JPO website, retrieved Jun. 16, 2010.

Japanese Official Action—Notification of Reasons for Refusal dated Jun. 7, 2007 and English translation, issued in connection with Japanese counterpart Application No. 2000-228463.

Japanese Office Action—further Notification of Reasons for Refusal, dated Oct. 23, 2007 and English translation, issued in connection with Japanese Application No. 2000-228463.

Taiwanese Office Action, dated Jul. 5, 2002 and English translation, issued in connection with the counterpart Taiwanese application.

German Office Action, dated Aug. 8, 2001 and English translation, issued in connection with German counterpart application DE 100 58 320.2.

German Office Action, dated Mar. 23, 2005 and English translation, issued in connection with German divisional application DE 100 66 124.6.

Jablonski et al., Jpn. 7. Appl. Phys., vol. 35 (1996) pp. 520-525.

* cited by examiner

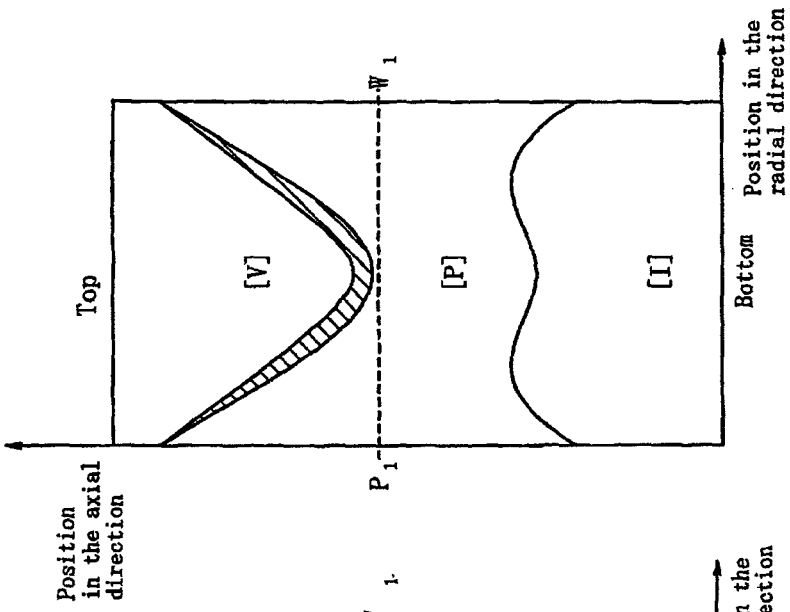
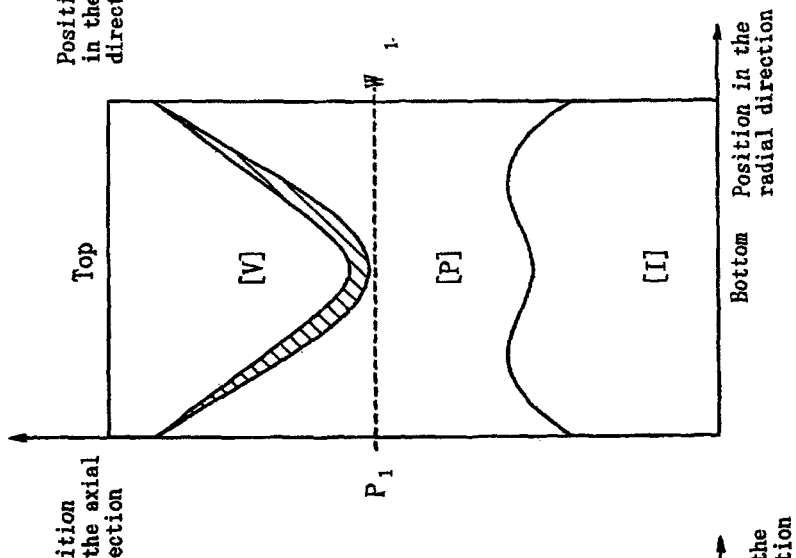
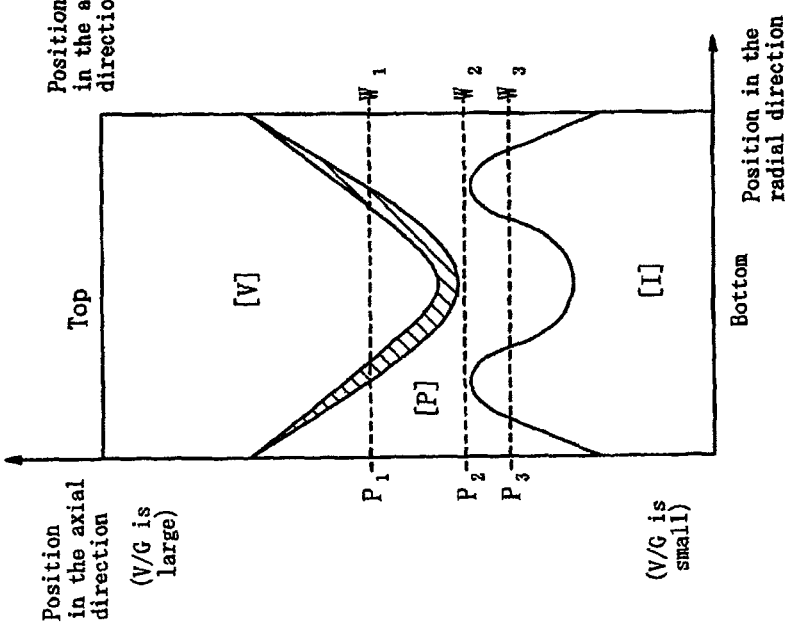

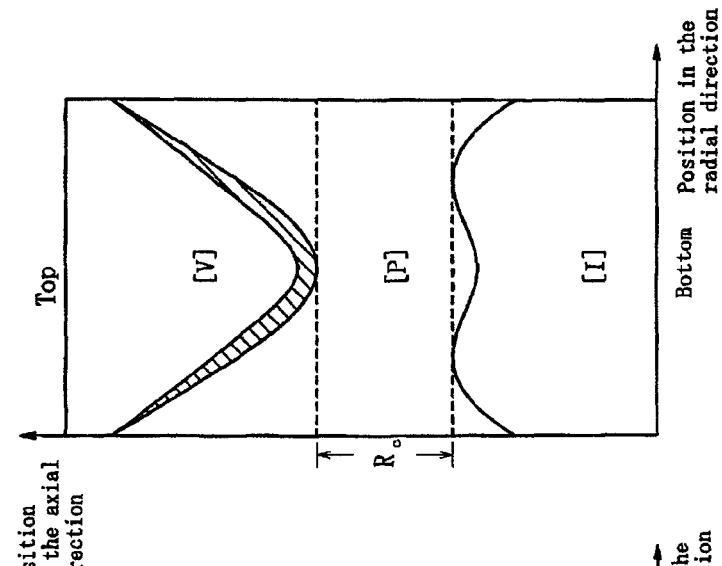
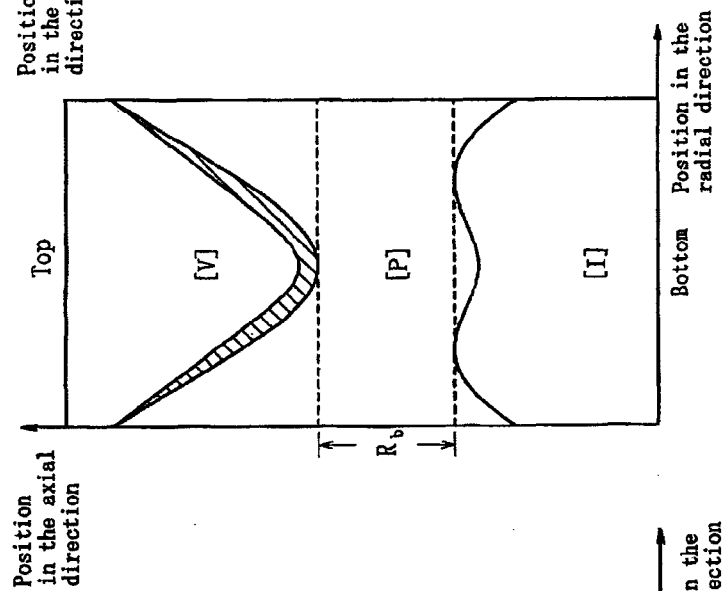
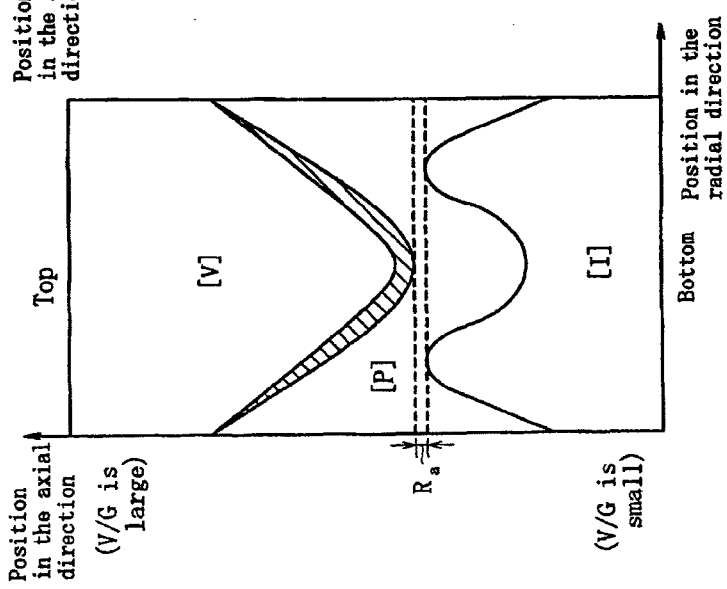

METHOD FOR MANUFACTURING A SILICON WAFER

CROSS-REFERENCE TO RELATED APPLICATIONS

This application is a divisional of application Ser. No. 09/718,659, filed Nov. 22, 2000 now abandon, the disclosure of which is incorporated by reference herein in its entirety.

BACKGROUND OF THE INVENTION

1. Field of the Invention

The present invention relates to a silicon wafer made of a single crystal silicon ingot grown by the Czochralski method (hereinafter, referred to as CZ method) and a method for manufacturing the same wafer. And it relates more particularly to a silicon wafer to be used for manufacturing a semiconductor device such as an LSI and the like.

2. Description of the Related Art

A semiconductor device such as an LSI and the like needs to exhibit such excellent electric characteristics that a leakage current is a little in a pn junction and an MOS transistor has a high reliability in a gate oxide film. Crystal defects in a silicon wafer to be a substrate and contamination caused by a metal element in the wafer are mentioned as the causes deteriorating these characteristics.

Above all among metal elements in a single crystal silicon, an iron element is thought to have a bad influence and this iron element is taken in by contamination from an environment or an apparatus.

As a technique for capturing a metal element such as an iron element from an operating domain of a silicon wafer, an intrinsic gettering (IG) method and an extrinsic gettering (EG) method which make a wafer itself have a gettering ability to capture a metal element have been known up to now. And as a technique for removing metal from the surface of a wafer to be an operating domain, an RCA cleaning method which cleans a silicon wafer with an SC-1 solution composed of hydrogen peroxide and ammonium hydroxide and then cleans it with an SC-2 solution composed of hydrogen peroxide and dilute hydrochloric acid is known.

In case that a large amount of metal element is mixed into a single crystal silicon ingot grown by the CZ method, however, it is necessary to more and more complicate or advance a technique for removing or capturing the metal element from a silicon wafer.

On the other hand, in a process of manufacturing a semiconductor integrated circuit in recent years, existence of a microscopic defect of oxygen precipitation to be a nucleus of an oxidation induced stacking fault (hereinafter, referred to as OSF) or a crystal originated particle (hereinafter, referred to as COP) or an interstitial-type large dislocation (hereinafter referred to as L/D) is mentioned as a cause lowering the yield rate. The OSF is made by a fact that a microscopic defect to be the nucleus of a crystal is introduced when growing the crystal, is actualized in a thermal oxidation process and the like when manufacturing a semiconductor device, and causes a failure such as the increase of leakage current in a manufactured device. And when a mirror-polished silicon wafer is cleaned with a mixed solution of ammonia and hydrogen peroxide, pits are formed on the surface of the wafer and when the wafer is measured by a particle counter, these pits are detected as original particles. Said pit is caused by a crystal and is called a COP in order to distinguish it from an original particle. The COP being a pit on the surface of a wafer causes deterioration in electric characteristics such as time dependent dielectric breakdown (TDDB), time zero dielectric breakdown (TZDB) and the like of an oxide film. And existence of COPs on the surface of a wafer makes a step in a wiring process of a device and can cause breaking of wire. And it may cause leakage and the like in an isolation part of a device and reduces the yield rate of a product. Moreover, an L/D is called a dislocation cluster or also called a dislocation pit for the reason that a pit appears when a silicon wafer having this defect is immersed in a selective etching solution having hydrogen fluoride as the chief ingredient. The L/D also causes deterioration in electric characteristics such as leakage characteristic, isolation characteristic and the like, for example.

Due to the above-mentioned circumstances, it is necessary to reduce OSF, COP and L/D from a silicon wafer to be used for manufacturing a semiconductor integrated circuit.

A silicon wafer of no defect having no OSF, COP nor L/D is disclosed in Japanese Patent Laid-Open Publication No. Hei 11-1393. When assuming that a perfect domain in which there are no vacancy point defect agglomerates nor interstitial silicon point defect agglomerates in a single silicon crystal ingot is [P], this silicon wafer of no defect is a silicon wafer cut out from an ingot composed of a perfect domain [P]. A perfect domain [P] exists between a domain [I] in which interstitial silicon point defects exist dominantly and a domain [V] in which vacancy point defects exist dominantly in a single silicon crystal ingot. When assuming that the pulling speed of an ingot is V mm/minute and the temperature gradient at the interface between a molten silicon liquid and the ingot in the vertical direction is G °C./mm, a silicon wafer composed of such a perfect domain [P] is made by determining the value of V/G $mm^2$/(minute °C.) so that OSFs to appear in the shape of a ring in a thermal oxidation process disappear in the center of the wafer.

On the other hand, it is required for a silicon wafer to have no OSF, COP nor L/D and further to be 1 to 15 Ωcm in resistivity so as to be compatible with an existing device process. And some of semiconductor device manufacturers demand a silicon wafer having the ability of gettering metal contamination generated in a device process. When a wafer having an insufficient gettering ability is contaminated by metal in a device process, a defective operation of a device is caused by a junction leakage or a trap state by a metal impurity and thereby the yield rate of the product is lowered.

A silicon wafer cut out from an ingot composed of said perfect domain [P] has ordinarily a resistivity of 1 to 15 Ωcm and does not have OSF, COP and L/D.

However, in a wafer being comparatively low in vacancy point defect density among silicon wafers composed of said perfect domain [P], oxygen precipitation does not always occur uniformly in the wafer in heat treatment in a device process and thereby the wafer sometimes cannot obtain a sufficient gettering effect.

And in case that the temperature gradient is constant, the value of V/G for producing a silicon wafer composed of a perfect domain [P] is in proportion to the pulling speed V of an ingot and it is required to pull the ingot at a comparatively low speed controlled within a narrow range, but it is not always technically easy to meet securely this requirement and the productivity of such an ingot also is not high.

SUMMARY OF THE INVENTION

A first object of the present invention is to provide a silicon wafer which does not have defects caused by crystal and which is low in the contamination degree by metal such as iron and excellent in electric characteristics, and provide a method for manufacturing the same.

A second object of the present invention is to provide a silicon wafer which has little agglomerates of point defects even if an ingot is pulled at a comparatively high speed and at a V/G value within a wide range, makes it possible to manufacture a semiconductor integrated circuit at a high yield rate and can be compatible with an existing device process thanks to its resistivity of 1 to 15 Ωcm and to provide a method for manufacturing the same.

A third object of the present invention is to provide a silicon wafer which can be adjusted so as to have a desired resistivity and a method for manufacturing the same.

A fourth object of the present invention is to provide a silicon wafer which is cut out from an ingot composed of a perfect domain [P] and can obtain a uniform gettering effect over the whole surface of the wafer by heat treatment in a device process and a method for manufacturing the same.

A first aspect of the present invention is a silicon wafer which is composed of a perfect domain in which, when assuming that the lower limit of detection of interstitial silicon point defect agglomerates or vacancy point defect agglomerates is $1 \times 10^3$ agglomerates/cm$^3$, the density of said point defect agglomerates is not larger than said lower limit of detection and which has the density of contaminant iron being not larger than $2 \times 10^9$ atoms/cm$^3$.

A silicon wafer according to the first aspect of the present invention has no defect caused by crystal and the density of contaminant iron being as low as $2 \times 10^9$ atoms/cm$^3$ or less, and therefore has a little leakage current in a pn junction and exhibits excellent electric characteristics such as a high reliability with respect to a gate oxide film of an MOS transistor and the like when a semiconductor device such as an LSI or the like is formed out of said wafer.

A second aspect of the present invention is a silicon wafer which, when assuming that the lower limit of detection of interstitial silicon point defect agglomerates or vacancy point defect agglomerates is $1 \times 10^3$ agglomerates/cm$^3$, has the density of point defect agglomerates being not larger than said lower limit of detection, is of p type in conduction type and has a resistivity adjusted within a range of 1 to 15 Ωcm.

A silicon wafer according to the second aspect of the present invention has little point defect agglomerates and therefore makes it possible to manufacture a semiconductor integrated circuit at a high yield rate. And since it has a resistivity of 1 to 15 Ωcm, it can be compatible with an existing device process.

A third aspect of the present invention is a method for manufacturing a silicon wafer-adjusted in resistivity from a single crystal silicon ingot by making a molten silicon liquid obtained by melting raw material silicon contain a p-type impurity and an n-type impurity so that in said single crystal silicon ingot said p-type impurity has a desired first density $C_1$ and said n-type impurity has a desired second density $C_2$ being smaller than said first density and by pulling said single crystal silicon ingot from said molten silicon liquid.

According to a manufacturing method of the third aspect of the present invention, since the second density $C_2$ of an n-type impurity is smaller than the first density $C_1$ of a p-type impurity, it is possible to manufacture a silicon wafer which is of p type in conduction type and is adjusted in resistivity.

A fourth aspect of the present invention is a silicon wafer which is cut out from an ingot composed of a perfect domain [P] in which, when assuming that the lower limit of detection of interstitial silicon point defect agglomerates or vacancy point defect agglomerates is $1 \times 10^3$ agglomerates/cm$^3$, the density of said point defect agglomerates is not larger than said lower limit of detection, said silicon wafer being composed of a domain [$P_I$] or both domains [$P_V$] and [$P_I$] and having domain [$P_V$]/domain [$P_I$] less than 9 in area ratio. This silicon wafer has a carbon density of $1 \times 10^{15}$ to $5 \times 10^{15}$ atoms/cm$^3$ or has a polysilicon layer of 0.1 to 1.6 μm in thickness formed on the back of the wafer.

A silicon wafer according to the fourth aspect of the present invention can provide a uniform gettering effect having no variation between the peripheral part and the middle part of the wafer, thanks to a fact that oxygen precipitation is performed uniformly the whole surface of a wafer, even if the wafer is abundant in domain [$P_I$], namely, more abundant in interstitial silicon point defect than in vacancy point defect, by making the wafer have a higher carbon density within said range than an ordinary CZ wafer or have a polysilicon layer formed on the back of the wafer and by heat-treating this wafer, for example, at 800° C. for 4 hours and then at 1000° C. for 16 hours.

The present invention also provides a silicon wafer manufacturing method comprising a first cleaning process of cleaning block-shaped or grain-shaped polycrystalline silicon with a dissolved ozone aqueous solution, a second cleaning process of cleaning the polycrystalline silicon cleaned in the first cleaning process with fluoric acid or mixed acid of fluoric acid and nitric acid, a process of rinsing the polycrystalline silicon cleaned in the second cleaning process with ultra pure water, a process of melting the rinsed polycrystalline silicon and pulling a single crystal silicon ingot from the molten silicon liquid at a solidification ratio of 0.9 or less, a process of making the pulled single crystal silicon ingot into block-shaped or grain-shaped single crystal silicon, a third cleaning process of cleaning the block-shaped or grain-shaped single crystal silicon with a dissolved ozone aqueous solution, a fourth cleaning process of cleaning the single crystal silicon cleaned in the third cleaning process with fluoric acid or mixed acid of fluoric acid and nitric acid, a process of rinsing the single crystal silicon cleaned in the fourth cleaning process with ultra pure water, a process of remelting the rinsed single crystal silicon and pulling again a single crystal silicon ingot from this molten silicon liquid at a solidification of 0.9 or less as controlling the pulling speed and the temperature gradient so that V/G is a ratio being not smaller than (V/G)$_1$ and not larger than (V/G)$_2$, and a process of forming a silicon wafer out of said single crystal silicon ingot, wherein V means a speed (mm/minute) of pulling an ingot from a molten silicon liquid, G means a temperature gradient (° C./mm) in the interface portion between the ingot and the molten silicon liquid, (V/G)$_1$ means a first critical ratio for preventing occurrence of interstitial silicon point defect agglomerates, and (V/G)$_2$ means a second critical ratio for limiting vacancy point defect agglomerates within a domain in the middle of the ingot where vacancy point defect agglomerates exist dominantly.

BRIEF DESCRIPTION OF THE DRAWINGS

FIG. 9A is a schematic diagram of an X-ray tomography showing a single crystal silicon ingot pulled varying the V/G value by doping boron at a low density according to the second embodiment of the present invention.

FIG. 9B is a schematic diagram of an X-ray tomography showing a single crystal silicon ingot pulled varying the V/G value by doping boron at a high density according to the same.

FIG. 9C is a schematic diagram of an X-ray tomography showing a single crystal silicon ingot pulled varying the V/G value by doping boron at a high density so as to be adjusted to 1 to 15 Ωcm resistivity according to the same.

FIG. 10A is a schematic diagram of an X-ray tomography showing a single crystal silicon ingot pulled varying the V/G value by doping boron at a low density according to the second embodiment of the present invention.

FIG. 10B is a schematic diagram of an X-ray tomography showing a single crystal silicon ingot pulled varying the V/G value by doping boron at a high density according to the same.

FIG. 10C is a schematic diagram of an X-ray tomography showing a single crystal silicon ingot pulled varying the V/G value by doping boron at a high density so as to be adjusted to 1 to 15 Ωcm in resistivity according to the same.

DETAILED DESCRIPTION OF EMBODIMENTS OF THE INVENTION

[A] First Embodiment of the Invention

Figure 1:
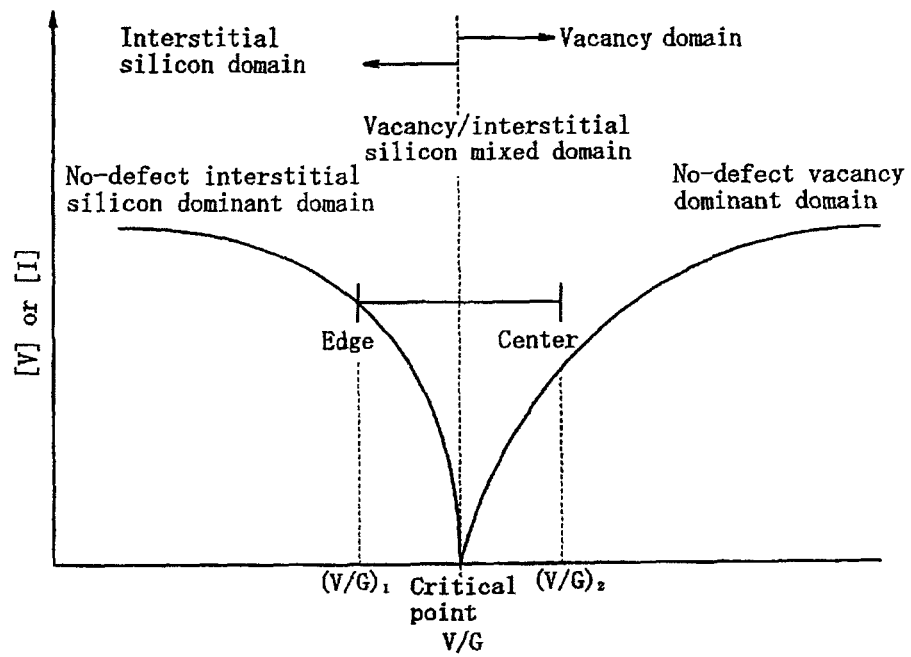
FIG. 1 shows the relation between the V/G ratio and the density of vacancy point defects or the density of interstitial silicon point defects on the basis of Voronkov theory in the first embodiment of the present invention.

A silicon wafer according to first to third embodiments of the present invention is made by pulling an ingot at a specified pulling speed profile based upon Voronkov theory from a molten silicon liquid inside a hot zone furnace by the CZ method and then slicing this ingot.

A method for manufacturing a single crystal silicon ingot containing less amount of metal element and having no defect according to the first embodiment of the present invention is described.

(1) Method for Manufacturing a Single Crystal Silicon Containing Less Amount of Metal Element A method for manufacturing a single crystal silicon ingot according to the first embodiment of the present invention, said ingot containing less amount of metal particularly iron, comprises a process of cleaning block-shaped or grain-shaped polycrystalline silicon to be raw material, a single crystal silicon pulling process of melting the cleaned material silicon and growing a single crystal silicon ingot from this molten silicon liquid at a solidification ratio of 0.9 or less by means of the CZ method, a process of making this pulled single crystal silicon into block-shaped or grain-shaped single crystal silicon, a process of cleaning the block-shaped or grain-shaped single crystal silicon, and a single crystal silicon re-pulling process of remelting the cleaned single crystal silicon and growing a single crystal silicon at a solidification ratio of 0.9 or less. What is here called a solidification ratio is the ratio of a grown single crystal silicon to the material silicon of 100% in weight percent.

In order to clean polycrystalline silicon or single crystal silicon to be raw material, a method is used which first cleans raw material silicon in the shape of blocks or grains with a dissolved ozone aqueous solution and then cleans it with hydrofluoric acid or hydrofluoric and nitric acid (mixed acid of hydrofluoric acid and nitric acid), and further cleans it with ultra pure water. It is preferable to repeat one or more times the cleaning process using hydrofluoric acid or hydrofluoric and nitric acid, or repeat one or more times a cleaning process using a dissolved ozone aqueous solution and a cleaning process using hydrofluoric acid or hydrofluoric and nitric acid.

Since such raw material silicon as polycrystalline silicon or single crystal silicon has an active property, it is sealed in a bag made of plastic until it is put into a quartz crucible. Before sealing or after opening the bag, however, the surface of raw material silicon is liable to react with oxygen in the air to form an oxide film. This oxide film contains metal impurities and the like attached to the surface of the raw material silicon, or metal impurities are attached to the surface of an oxide film after the oxide film is formed.

In the above-mentioned method, an oxide film is formed the whole surface of silicon by a fact that the surface of silicon is forcedly oxidized by cleaning with a dissolved ozone aqueous solution, and then this oxide film is removed by cleaning with hydrofluoric acid or hydrofluoric and nitric acid. As the result, metal impurities and the like contained in the oxide film are removed together with the oxide film. The removing effect is enhanced by repeating one or more times a cleaning process using hydrofluoric acid or hydrofluoric and nitric acid.

Raw material silicon obtained by the above-mentioned cleaning is molten in a furnace based upon the CZ method to become a molten silicon liquid. Here, the solidification ratio at the first pulling operation is set at 0.9 or less and the solidification ratio at a pulling operation after remelting is set at 0.9 or less, preferably 0.8 or less, respectively.

The reason why the solidification ratio is set at said value or less is as follows. A portion grown when the solidification ratio is small and a large amount of molten silicon liquid remains inside a quartz crucible, namely, a portion close to the top of an ingot has a little mount of metal element such as iron or the like mixed into the molten silicon liquid. On the other hand, as the residue of the molten silicon liquid becomes smaller and the solidification ratio becomes larger, the density of metal element in the residual liquid becomes higher and a larger amount of metal element is mixed into the ingot.

Cleaning and remelting of raw material silicon at a specified or lower solidification ratio make the density of contaminant iron in a single crystal silicon be $2 \times 10^9$ atoms/cm$^3$ or less.

(2) Method for Manufacturing a Single Crystal Silicon of No Defect

Next, a method for manufacturing a single silicon crystal of no defect having no vacancy point defect agglomerates nor interstitial point defect agglomerates is described. A single crystal silicon ingot according to the first embodiment of the present invention is pulled at a specified pulling speed profile based upon Voronkov theory as described above. And a silicon wafer of the first embodiment of the present invention is made by slicing this ingot.

Generally, when a single crystal silicon ingot is pulled from a molten silicon liquid inside a hot zone furnace by means of the CZ method, point defects and point defect agglomerates (three-dimensional defects) are generated as defects in a single crystal silicon. A point defect includes two general forms of a vacancy point defect and an interstitial silicon point defect. A vacancy point defect is a defect in which a silicon atom has slipped off from a normal position in a silicon crystal lattice. Such a hole becomes a vacancy point defect. On the other hand, an atom found at a position (interstitial site) other than lattice points of a silicon crystal becomes an interstitial silicon point defect.

A point defect is generally formed at the interface between a molten silicon liquid (molten silicon) and an ingot (solid silicon). However, a portion which has formed the interface begins cooling with pulling. During the cooling, vacancy point defects or interstitial silicon point defects are merged with one another due to diffusion to form vacancy point defect agglomerates or interstitial point defect agglomerates. In other words, agglomerates are of three-dimensional structure caused by merging of point defects.

Vacancy agglomerates include defects called laser scattering tomography defects (LSTD) or flow pattern defects (FPD) in addition to COP described above, and interstitial silicon point defect agglomerates include defects called L/D described above. FPD is a source of traces presenting a peculiar pattern to appear when a silicon wafer made by slicing an ingot is Secco-etched (etched with a mixed solution of (K$_2$Cr$_2$O$_7$:50% HF:pure water=44 g:2000 cc:1000 cc) without stirring for 30 minutes, and LSTD has a refractive index different from silicon and is a source generating scattered light when a single silicon crystal is irradiated with infrared rays.

When assuming that the pulling speed of an ingot is V mm/minute and the temperature gradient at the interface between an ingot and a molten silicon liquid in a hot zone structure is G °C./mm, Voronkov theory is to control the mm$^2$/(minute °C.) in order to grow a high-purity ingot having a small number of defects. Concretely, G is a temperature gradient in the vertical direction in an ingot of 1412 to 1300° C. in temperature being close to the interface between the ingot and the molten silicon liquid. As shown in FIG. 1, this theory represents diagrammatically the density of vacancies and the density of interstitial silicon as a function of V/G, and explains that the boundary between a vacancy domain and an interstitial silicon domain in a wafer is determined by V/G. In more detail, while an ingot in which vacancy point defects dominantly exist is formed in case that the ratio of V/G is not lower than the critical point, an ingot in which interstitial silicon point defects dominantly exist is formed in case that the ratio of V/G is not higher than the critical point.

A specified pulling speed profile of the first embodiment of the present invention is determined so that, when an ingot is pulled from a molten silicon liquid inside a hot zone furnace, the ratio of a pulling speed to a temperature gradient (V/G) is kept to be not lower than a first critical ratio (V/G)$_1$ for preventing occurrence of interstitial silicon point defect agglomerates and not higher than a second critical ratio (V/G)$_2$ for limiting vacancy point defect agglomerates within a domain in the middle of the ingot in which vacancy point defects exist dominantly.

Figure 2:
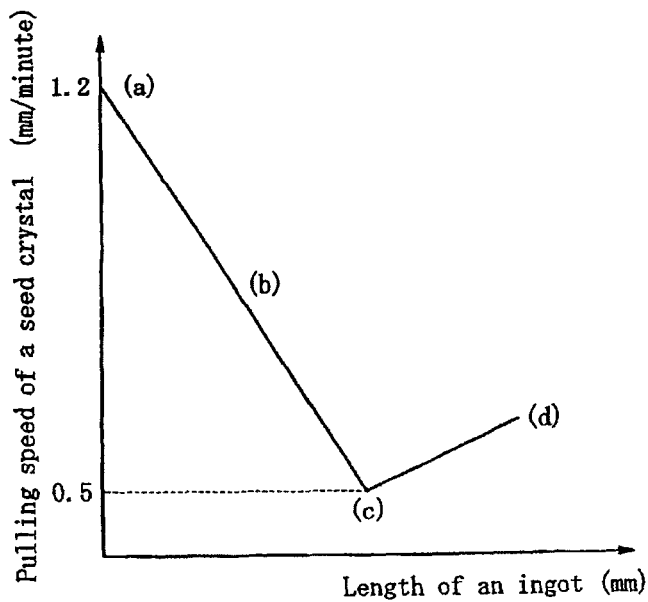
FIG. 2 is a characteristic diagram showing variation in the pulling speed for determining a desired pulling speed profile.

The pulling speed profile is determined on the basis of the above-mentioned Voronkov theory by simulation through slicing experimentally a reference ingot in the axial direction and slicing experimentally a reference ingot into wafers, or combining these techniques. Namely, this determination is performed by slicing an ingot in the axial direction after simulation and checking a sliced wafer, and further repeating simulation. For the purpose of simulation, a plurality of pulling speeds are determined within a specified range and a plurality of ingots are grown. The pulling speed profile for the simulation is adjusted from a higher pulling speed such as 1.2 mm/min as shown in FIG. 2(a), via a lower pulling speed such as 0.5 mm/min as shown in FIG. 2(c), to a pulling speed as shown in FIG. 2(d). The above-mentioned low pulling speed may be 0.4 mm/minute or lower, and it is preferable that the change in pulling speeds (b) and (d) is linear.

Plural ingots pulled at different speeds are sliced respectively in the axial direction. The optimum V/G is determined from the correlation among slicing in the axial direction, checking of wafers and the result of simulation, and following this, the optimum pulling speed profile is determined and an ingot is manufactured by means of this profile. An actual pulling speed profile depends upon a number of variables including the diameter of a desired ingot, a specific hot zone furnace to be used and the quality of a molten silicon liquid, but being not limited to these.

Figure 3:
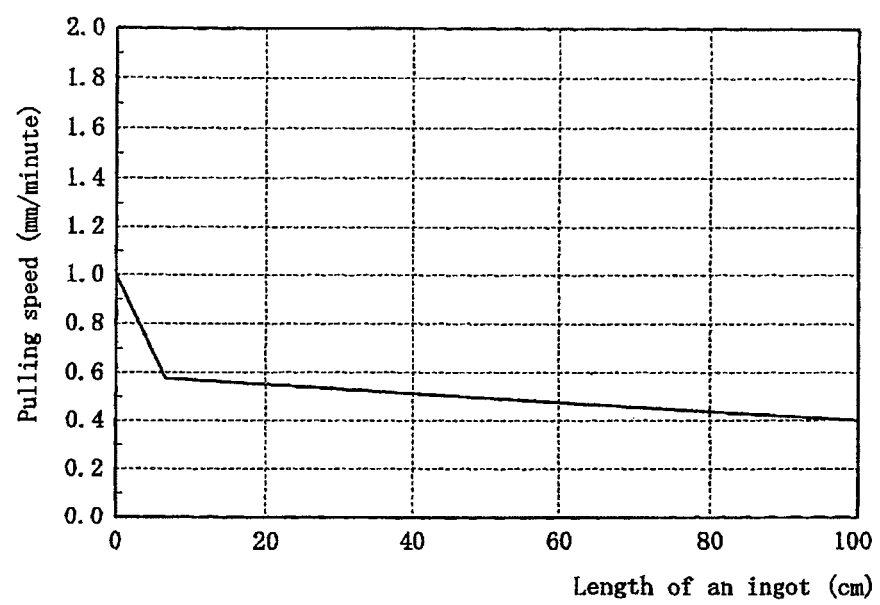
FIG. 3 is a characteristic diagram showing the pulling speed profile for growing a wafer in which vacancy point defects are dominant and a perfect wafer according to the first embodiment of the present invention.

FIG. 3 shows a profile of the pulling speed for growing an ingot of 100 cm in length and 200 mm in diameter determined utilizing combination of simulation and an experimental technique. Here, a hot zone furnace of Model Q41 being based upon the CZ method and manufactured by Ikuno Plant of Mitsubishi Material Silicon Corporation was used.

Figure 4:
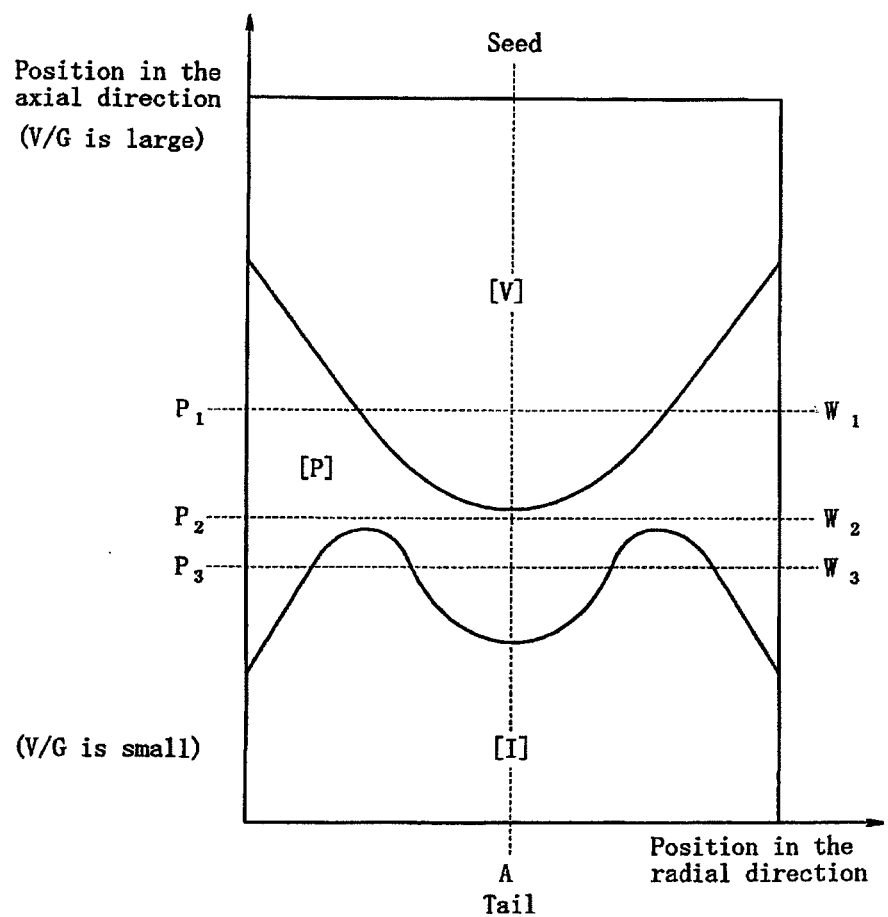
FIG. 4 is a schematic diagram of an X-ray tomography showing a domain in which vacancy point defects are dominant, a domain in which interstitial point defects are dominant and a perfect domain of a reference ingot according to the first and the third embodiment of the present invention.

A fact shown in FIG. 4 is understood by drawing a sectional view of an ingot made as gradually reducing the pulling speed and continuously lowering the V/G. FIG. 4 shows as [V] a domain in which there are dominantly vacancy point defects in the ingot, as [I] a domain in which there are dominantly interstitial silicon point defects, and as [P] a perfect domain in which there are no vacancy point defect agglomerates and no interstitial silicon point defect agglomerates. As shown in FIG. 4, position P$_1$ in the axial direction of the ingot includes a domain in which vacancy point defects dominantly exist in the middle part. Position P$_3$ includes a ring domain in which interstitial silicon point defects dominantly exist and a perfect domain in the middle. And since position P$_2$ has no vacancy point defect agglomerates in the middle part and no interstitial silicon point defect agglomerates in the peripheral part related to the first embodiment of the present invention, it is entirely a perfect domain.

Figure 5:
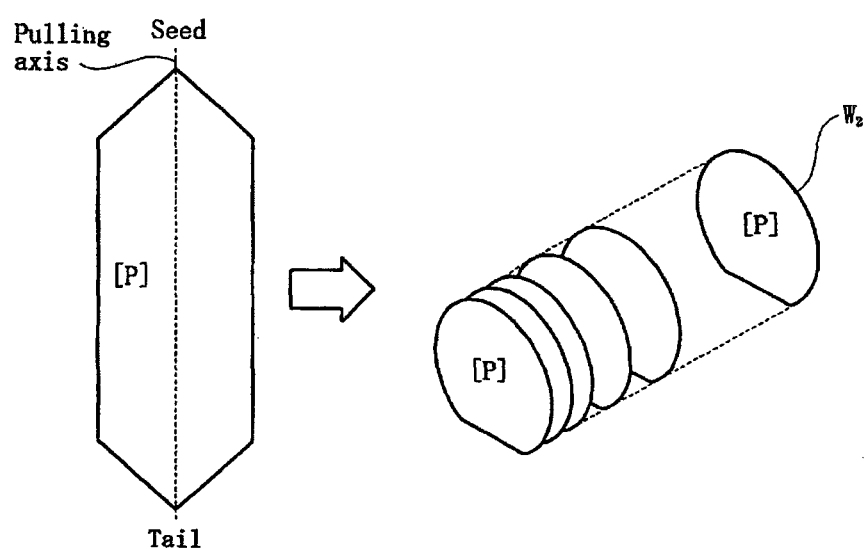
FIG. 5 is a figure for explaining an ingot and a wafer in which there are no vacancy point defect agglomerates nor interstitial silicon point defect agglomerates of the present invention.
Figure 6:
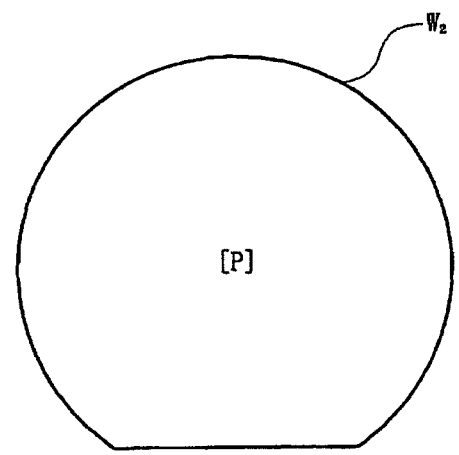
FIG. 6 is a plan view of such a wafer.
Figure 7:
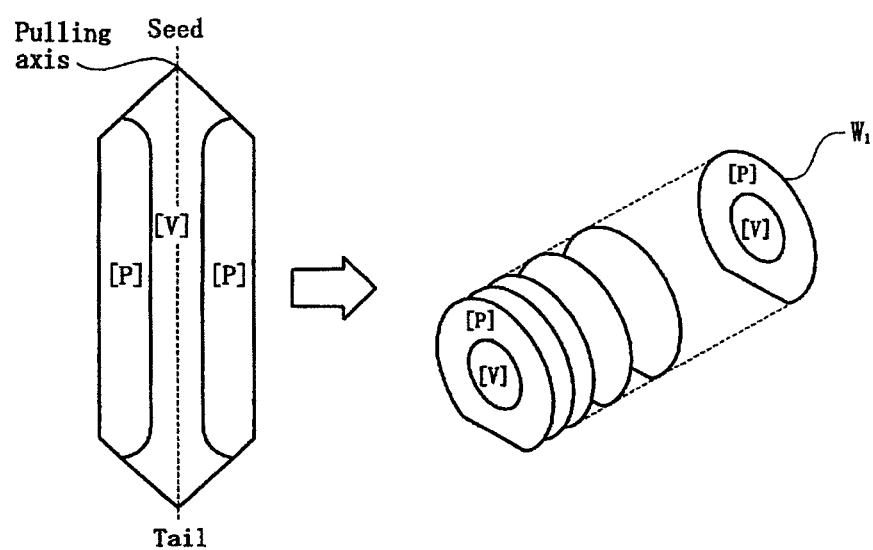
FIG. 7 is a figure for explaining an ingot and a wafer which have a domain where vacancy point defects are dominant in its middle part and a domain of no defect between the domain where vacancy point defects are dominant and the rim of the wafer.
Figure 8:
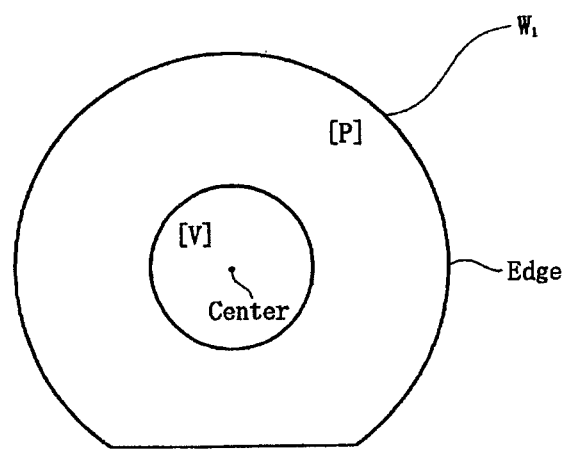
FIG. 8 is a plan view of such a wafer.

As apparently seen from FIG. 4, a wafer W$_1$ corresponding to position P$_1$ contains in the middle part a domain in which vacancy point defects dominantly exist. A wafer W$_3$ corresponding to position P$_3$ contains a ring domain in which interstitial silicon point defects dominantly exist and a central perfect domain. And since a wafer W$_2$ corresponding to position $P_2$ has no vacancy point defect agglomerates in the middle part nor interstitial silicon point defect agglomerates in the peripheral part, it is entirely a perfect domain. A wafer $W_2$ is made by slicing an ingot grown at a pulling speed profile selected and determined so as to make entirely a perfect domain as shown in FIG. 5. FIG. 6 is a plan view of it. For reference, a wafer $W_1$ made by slicing an ingot grown at another pulling speed profile is shown in FIG. 7. FIG. 8 shows a plan view of it.

A silicon wafer of the first embodiment of the present invention is a wafer $W_2$ described above, which is obtained by lapping, beveling and then mirror-polishing this wafer. This silicon wafer has no defects caused by crystal, is low in the contamination degree of metal elements including iron, chromium and nickel, and is excellent in electric characteristics. As the result, a semiconductor device such as an LSI and the like made of such a wafer is a little in leakage current in a pn junction and has a high reliability with respect to a gate oxide film of an MOS transistor.

[B] Second Embodiment of the Invention

A silicon wafer of a second embodiment of the present invention is made by pulling an ingot under a specified condition from a molten silicon liquid inside a hot zone furnace by means of the CZ method in the same way as the first embodiment and then slicing this ingot.

As described above, this CZ silicon wafer sometimes has OSF in the shape of a ring when it receives a thermal oxidation process. This OSF ring expands toward the outer circumference as the V/G value increases, and reduces its ring diameter and becomes disk-shaped in the center of the wafer and then disappears as the V/G value decreases.

This fact is described with reference to FIG. 9A. FIG. 9A shows a vertical section of an ingot obtained by gradually reducing the pulling speed and continuously decreasing the value of V/G. This ingot has been pulled as being doped with boron at a density of $1 \times 10^{15}$ atoms/cm$^3$ so that its conduction type is a p type and its resistivity is 1 to 15 Ωcm. In the same way as FIG. 4 described above, FIG. 9A shows a domain [V] in which there are dominantly vacancy point defects, a domain [I] in which there are dominantly interstitial silicon point defects, and a perfect domain [P] in which there are no vacancy point defect agglomerates nor interstitial silicon point defect agglomerates in the ingot.

Positions $P_1$, $P_2$ and $P_3$ in the axial direction are the same as those of the first embodiment. And wafers $W_1$, $W_2$ and $W_3$ respectively corresponding to positions $P_1$, $P_2$ and $P_3$ are also the same as those of the first embodiment. A small domain of a domain in which vacancy point defects dominantly exist, said small domain being adjacent to a perfect domain, is a domain in which there is substantially no COP nor L/D in the wafer face.

Figure 11:
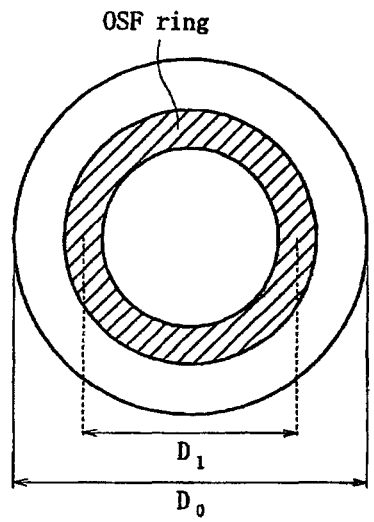
FIG. 11 is a plan view of a silicon wafer where OSF appears.

However, when this silicon wafer $W_1$ is heat-treated in an oxygen atmosphere at a temperature of 1000° C.±30° C. for 2 to 5 hours and successively heat-treated at a temperature of 1130° C.±30° C. for 1 to 16 hours, OSF appears. This heat treatment is called an OSF actualizing heat treatment. As shown in FIG. 11, an OSF ring appears in the vicinity of half the radius of the wafer in the wafer $W_1$. COP appears in the domain [V] which is surrounded by this OSF ring and in which there are dominantly vacancy point defects.

Figure 12:
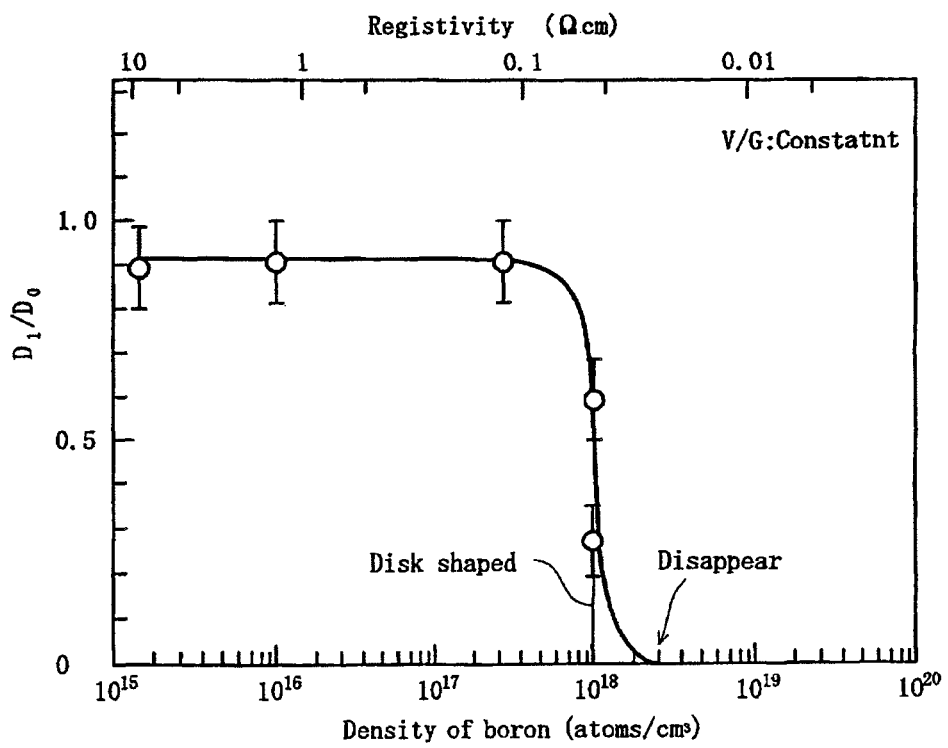
FIG. 12 shows variation in the value of $D_1/D_0$ when keeping the V/G value constant and varying the density of boron.

On the other hand, even when keeping the value of V/G constant, the diameter of this OSF ring varies according to an amount of doped boron (B) being a p-type impurity. On the assumption that the ring diameter of OSF is $D_1$ and the diameter of a wafer is $D_0$ as shown in FIG. 11, the relation between $D_1/D_0$ and the density of boron at this time is shown in FIG. 12. As apparently seen from FIG. 12, the OSF is in the shape of a ring at a boron density of $2 \times 10^{17}$ atoms/cm$^3$ or less, comes to be in the shape of a disk at a boron density of about $6 \times 10^{17}$ atoms/cm$^3$, and disappears at a boron-density of $9 \times 10^{17}$ atoms/cm$^3$ or more.

FIGS. 9B and 9C respectively show vertical sections of ingots at the same axial position as FIG. 9A when continuously decreasing the value of V/G. FIG. 9B shows an ingot pulled as being doped with boron of $1 \times 10^{18}$ atoms/cm$^3$ in density so that it is of p type in conduction type and is 0.04 Ωcm or less in resistivity. And FIG. 9C shows an ingot pulled as being doped with boron of $1 \times 10^{18}$ atoms/cm$^3$ in density and phosphorus of $0.999 \times 10^{18}$ to $0.985 \times 10^{18}$ atoms/cm$^3$ in density so that it is of p type in conduction type and is within 1 to 15 Ωcm in resistivity.

In FIGS. 9B and 9C, a wafer in which OSF to appear in the shape of a ring at the same position $P_1$ as FIG. 9A when the wafer is thermally oxidized has disappeared in the center of the wafer is obtained. A wafer represented at position $P_1$ in FIGS. 9B and 9C is a wafer corresponding to position $P_2$ in FIG. 9A, which wafer has substantially no vacancy point defect agglomerates in the middle part of it and no interstitial silicon point defect agglomerates in the peripheral part, and therefore is a wafer entirely composed of a perfect domain. However, a wafer represented at position $P_1$ in FIG. 9B is as low as 0.04 Ωcm or less in resistivity, and therefore although this wafer is suitable for a substrate for an epitaxial wafer having an epitaxial layer of 10 Ωcm or so stacked on the surface of the wafer, it cannot be compatible with an existing device process in case that it remains in a resistivity of 0.04 Ωcm or less. On the other hand, a wafer represented at position $P_1$ in FIG. 9C is a wafer which is 1 to 15 Ωcm in resistivity and can be compatible with an existing device process, and has the density of point defect agglomerates such as COP or L/D being not larger than the lower limit of detection.

Since the sensitivity of detection and the lower limit of detection of point defect agglomerates such as COP or L/D may be different depending on a detection method, this specification determines as the lower limit of detection ($1 \times 10^3$ agglomerates/cm$^3$) the ratio of the number of agglomerates to the inspected volume in case that when a single crystal silicon mirror-polished is etched without stirring and then is observed by an optical microscope taking the product of an observed area and an etching allowance as an inspected volume, one flow pattern (vacancy defect agglomerate) or one dislocation cluster (interstitial silicon point defect agglomerate) has been detected in an inspected volume of $1 \times 10^{-3}$ cm$^3$.

FIGS. 10A to 10C show vertical sections of ingots substantially equivalent to those of FIGS. 9A to 9C. FIGS. 10A, 10B and 10C respectively correspond to FIGS. 9A, 9B and 9C. FIGS. 10A to 10C compare with one another and show the ranges of V/G in which an entirely perfect domain [P] having substantially no vacancy point defect agglomerates nor interstitial silicon point defect agglomerates can be manufactured. As apparently seen from FIGS. 10A to 10C, the range of V/G in which a perfect domain [E] can be manufactured is as small as Ra in FIG. 10A, but it becomes Rb and Rc wider than Ra respectively in FIGS. 10B and 10C, where a single crystal silicon composed of a perfect domain over its whole length can be easily manufactured without performing a strict pulling control of V/G.

Next, a method for manufacturing a silicon wafer represented at position $P_1$ of FIG. 9C.

Phosphorus, antimony and arsenic are mentioned as n-type impurities to be doped in order to compensate the resistivity of a silicon wafer which becomes low in resistivity by being densely doped with boron being a p-type impurity. Among them, phosphorus is more preferable since it is the nearest to a silicon atom in the covalent bond radius. On the assumption that the density of boron being a p-type impurity is the first density $C_1$, density $C_1$ needs to be within a range of $1 \times 10^{17}$ to $1 \times 10^{20}$ atoms/cm$^3$ in order to obtain a wafer in which OSF to appear in the shape of a ring when the wafer is thermally oxidized has disappeared in the center of the wafer. The density $C_1$ is preferably within a range of $1 \times 10^{18}$ to $1 \times 10^{19}$ atoms/cm$^3$. And when assuming that the density of phosphorus being an n-type impurity is the second density $C_2$, density $C_2$ needs to be within a range of $0.90 C_1$ to $0.999 C_1$ atoms/cm$^3$ being lower than density $C_1$. The reason is that the resistivity of a p-type wafer is compensated so as to be 1 to 15 Ωcm. This density $C_2$ is preferably within a range of $0.95 C_1$ to $0.995 C_1$ atoms/cm$^3$.

Since the segregation coefficient of a p-type impurity and the segregation coefficient of an n-type impurity are different from each other, resistivity largely varies in the top side and the bottom side of an ingot with the increase of the length of an ingot. As a method for pulling a single crystal silicon (ingot), therefore, a continuously charged CZ (CCZ) method making it possible to additionally supply a dopant is preferable since it can make an ingot uniform in resistivity over the whole length of an ingot.

Since point defect agglomerates hardly exist in a wafer of the second embodiment of the present invention, it makes it possible to manufacture a semiconductor integrated circuit at a high yield rate. And since it is 1 to 15 Ωcm in resistivity, it can be compatible with an existing device process. And since both of a p-type impurity and an n-type impurity being less in quantity than the p-type impurity are doped when pulling a single crystal silicon, a p-type silicon wafer which has been adjusted to a desired resistivity can be obtained.

Moreover, by pulling an ingot making the first density $C_1$ of boron being a p-type impurity be $1 \times 10^{17}$ atoms/cm$^3$ or more under the value of V/G so that OSFs to appear in the shape of a ring when a wafer is thermally oxidized disappears in the center of the wafer, first, oxygen precipitation is uniformly and densely generated by heat treatment on the whole surface of a silicon wafer formed out of this ingot. This oxygen precipitation is hereinafter called a bulk micro-defect (BMD). This BMD provides a so-called intrinsic gettering (hereinafter referred to as IG) effect to capture a very small amount of metal impurity entering during a device process. Second, since densely doped boron atoms act mutually both interstitial silicon and vacancy to thereby lower the degree of supersaturation of interstitial silicon, it is thought that formation of interstitial point defect agglomerates is suppressed and L/D does not appear at all in the silicon wafer. Third, since a pulling speed V when OSFs disappear in the center of a wafer is higher in comparison with the conventional speed in which a boron-doped ingot being 10 Ωcm in resistivity is obtained, the productivity of ingots is enhanced. Furthermore, fourth, when the density $C_1$ of boron is made to be $1 \times 10^{18}$ atoms/cm$^3$ or more, a silicon wafer becomes naturally 0.04 Ωcm or less in resistivity, but the resistivity of the silicon wafer is adjusted or compensated to 1 to 15 Ωcm by doping an n-type impurity of phosphorus, antimony or arsenic at a density $C_2$ of $0.90 C_1$ to $0.999 C_1$ atoms/cm$^3$.

[C] Third Embodiment of the Invention

A silicon wafer of a third embodiment of the present invention is made by pulling an ingot under a specified condition from a molten silicon liquid inside a hot zone furnace by means of the CZ method in the same way as the first embodiment and then slicing this ingot.

Figure 13:
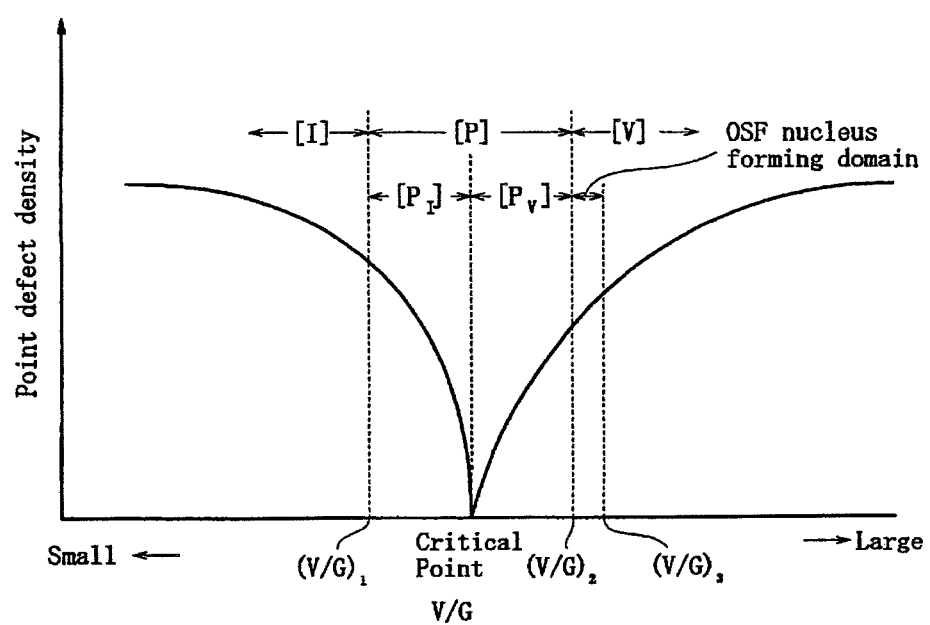
FIG. 13 shows the relation between the V/G ratio and the density of vacancy point defects or the density of interstitial silicon point defects on the basis of Voronkov theory in the third embodiment of the present invention.

FIG. 13 is a characteristic diagram corresponding to FIG. 1 of the first embodiment. Here, it is described that there is a domain $((V/G)_2$ to $(V/G)_3)$ for forming an OSF nucleus in a domain [V] adjacent to a domain [P] and that a perfect domain [P] is further classified into a domain [$P_I$] and a domain [$P_V$]. This domain $((V/G)_2$ to $(V/G)_3)$ is a small domain of a domain in which vacancy point defects dominantly exist, said small domain being adjacent to a perfect domain, and is a domain in which no COP nor L/D is generated in the wafer. Domain [$P_I$] is a domain where the ratio of V/G ranges from said $(V/G)_1$ to the critical point, and domain [$P_V$] is a domain where the ratio of V/G ranges from the critical point to said $(V/G)_2$. Namely, domain [$P_I$] is a domain which is adjacent to domain [I] and belongs to the perfect domain [P], and has the density of interstitial point defects less than the minimum density of interstitial silicon point defects capable of forming interstitial-type large dislocations, and domain [$P_V$] is a domain which is adjacent to domain [V] and belongs to a perfect domain [P], and has the density of vacancy point defects less than the minimum density of vacancy point defects capable of forming OSF.

A specified pulling speed profile of the third embodiment of the present invention is determined in the same way as the first embodiment so that, when an ingot is pulled from a molten silicon liquid inside a hot zone furnace, the ratio of a pulling speed to a temperature gradient (V/G) is kept to be not lower than the first critical ratio $(V/G)_1$ and not higher than the second critical ratio $(V/G)_2$.

Figure 14:
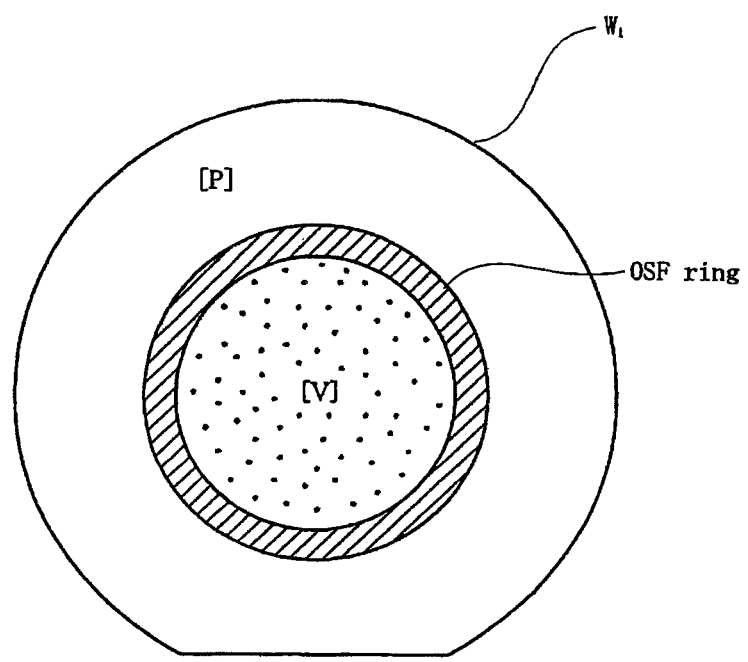
FIG. 14 shows the state where an OSF ring appears on a silicon wafer $W_1$ corresponding to position $P_1$ of FIG. 4.

A sectional view of an ingot obtained by gradually lowering the pulling speed and continuously decreasing the V/G is shown in FIG. 4 described in the first embodiment. When a conventional OSF actualizing heat treatment is performed on a silicon wafer $W_1$ shown in FIG. 4, OSF is generated as described above. As shown in FIG. 14, an OSF ring appears in the vicinity of half the radius of the wafer $W_1$. COP tends to appear in a domain surrounded by this OSF ring in which domain there are dominantly vacancy point defects.

In case that a silicon wafer of the third embodiment of the present invention is composed of domain [$P_I$] as described above or domain [$P_V$]/[$P_I$] is less than 9 in area ratio, since the density of vacancy point defects is low, first the density of carbon in the wafer is controlled to be $1 \times 10^{15}$ to $5 \times 10^{15}$ atoms/cm$^3$ or second a polysilicon layer of 0.1 to 1.6 μm in thickness is formed on the back of the wafer, or third both of them are performed. By performing the first to the third control or processing, even if the density of vacancy point defects is low, BMD is made by a specified heat treatment and a uniform IG effect is obtained over the whole surface of a wafer. This specified heat treatment includes a wafer heat treatment and the like in a device manufacturing process. For example, a wafer is heat-treated at a temperature of 600 to 800° C. for 1 to 24 hours in an atmosphere of nitrogen or oxygen as the first stage heat treatment, and then is heat-treated at a temperature of 1000 to 1150° C. for 1 to 16 hours in an atmosphere of nitrogen or oxygen as the second stage heat treatment. Preferably, it is heat-treated at 800° C. for 4 hours and then is heat-treated at 1000° C. for 16 hours.

The first control of the density of carbon in a wafer is performed so that the density of carbon [Cs] in an ingot becomes $1 \times 10^{15}$ to $5 \times 10^{15}$ atoms/cm$^3$ by adding pure carbon when melting polycrystalline silicon on the basis of the CZ method. When the density of carbon is less than $1 \times 10^{15}$ atoms/cm$^3$, a sufficient IG effect cannot be obtained, and when the density of carbon is more than $5 \times 10^{15}$ atoms/cm$^3$, excessive precipitation of oxygen precipitation nuclei occurs at a specified heat treatment and there is a disadvantage that excessive BMD is generated.

And in the second formation of a polysilicon layer on the back of the wafer, a polysilicon layer of 0.1 to 1.6 μm, preferably 0.5 to 1.0 μm in thickness is formed at a temperature of 650° C.±30° C. using, for example, $SiH_4$ by means of a chemical vapor deposition (CVD) method on the back of a wafer made by slicing an ingot pulled under said condition. A polysilicon layer being less than 0.1 μm in thickness cannot provide a sufficient IG effect and a polysilicon layer exceeding 1.6 μm in thickness provides a disadvantage of lowering the productivity. The density of oxygen in a silicon wafer of the third embodiment is $1\times10^{18}$ to $1.45\times10^{18}$ atoms/cm$^3$ (old ASTM).

As described above, according to the third embodiment, even when the density of vacancy point defects is low, BMD can be generated by a specified heat treatment and an IG effect can be obtained.

Embodiment Examples

Next, embodiment examples of the present invention are explained together with comparative examples.

Embodiment Example 1

The density of iron in polycrystalline silicon to be raw material was measured by an inductively coupled plasma (ICP) mass spectrometer and was found to be 2 ppb-wt on the average. That the density of iron is 2 ppb-wt means that iron is contained at a ratio of 2 ppb in silicon of 1 gram.

Generally, the density of an impurity in a single crystal silicon is very small due to segregation and is often difficult to directly analyze. Thereupon, a method is adopted which grows a single crystal by means of the CZ method and then analyzes a molten silicon liquid left in a crucible (hereinafter, referred to as residual molten silicon), and calculates the density of impurity in the crystal from the segregation coefficient of each impurity element. This analysis is ordinarily performed by sampling and solidifying a part of residual molten silicon and then dissolving the total amount of this sample in mixed acid of hydrofluoric acid and nitric acid being high in purity and analyzing it by means of an ICP mass spectrometer.

In this embodiment example, a residual molten silicon analysis of a molten silicon liquid obtained by melting polycrystalline silicon and a remelting test of a single crystal silicon were performed in advance and the densities of iron, chromium and nickel among metal impurities were examined. Namely, a single crystal was pulled to a length of 220 mm from a molten silicon liquid obtained by melting said polycrystalline silicon. The residual molten silicon at a solidification ratio of 0.626 was sampled and solidified, and the densities of iron, chromium and nickel were measured. And the densities of iron, chromium and nickel in the top portion of the single crystal were also measured. Next, the grown single crystal silicon was molten again (remolten) and a single crystal was pulled also to a length of 220 mm from this molten silicon liquid. The residual molten silicon at a solidification ratio of 0.681 was sampled and solidified, and the densities of iron, chromium and nickel were measured. And the densities of iron, chromium and nickel in the top portion of the single crystal were also measured.

The densities of impurities in the top portions of the respective single crystals pulled from said first molten silicon liquid and the remolten silicon liquid were calculated using the following expression (1) on the assumption that all the impurities were mixed into the molten silicon liquids before growing the crystals.

$$C_T = k_0 C_Z / ((1-L)^{(k0-1)}) \qquad (1)$$

Here, $C_T$ is the density of an impurity in the top Portion, $k_0$ is a segregation coefficient, $C_Z$ is the density of the impurity in the residual molten silicon, and L is the solidification ratio at the time of analyzing the residual molten silicon. Iron has a segregation coefficient of $8\times10^{-6}$, chromium has a segregation coefficient of $2.8\times10^{-5}$, and nickel has a segregation coefficient of $3\times10^{-5}$.

The densities of impurities in the residual molten silicon, the densities of impurities in the top portion and the like are shown in Table 1.

TABLE 1

| | | Polycrystaline silicon | Single crystal obtained by remelting (at a solidification ratio of 0.9 or less) |
|---|---|---|---|
| Iron | Solidification ratio | 0.626 | 0.681 |
| | Density of impurity in residual molten silicon (ppb-wt) | 23 | 14 |
| | Density of impurity in the top portion of crystal (atoms/cm$^3$) | $2 \times 10^9$ | $0.9 \times 10^9$ |
| | Density of impurity at a solidification ratio of 0.6 (atoms/cm$^3$) | $5 \times 10^9$ | $2.2 \times 10^9$ |
| Chromium | Solidification ratio | 0.626 | 0.681 |
| | Density of impurity in residual molten silicon (ppb-wt) | 3.8 | 0.8 |
| | Density of impurity in the top portion of crystal (atoms/cm$^3$) | $1.1 \times 10^9$ | $0.2 \times 10^9$ |
| | Density of impurity at a solidification ratio of 0.6 (atoms/cm$^3$) | $2.8 \times 10^9$ | $0.5 \times 10^9$ |
| Nickel | Solidification ratio | 0.626 | 0.681 |
| | Density of impurity in residual molten silicon (ppb-wt) | 3.8 | 0.8 |
| | Density of impurity in the top portion of crystal (atoms/cm$^3$) | $1.1 \times 10^9$ | $0.2 \times 10^9$ |
| | Density of impurity at a solidification ratio of 0.6 (atoms/cm$^3$) | $2.8 \times 10^9$ | $0.5 \times 10^9$ |

As apparently understood from consideration in advance of Table 1, it was found that the density of each of iron, chromium and nickel was reduced by remelting.

Block-shaped polycrystalline silicon used in the consideration in advance was put in a basket made of polyethylene and this basket was placed in a first tub and a dissolved ozone aqueous solution of 20 ppm in ozone density was jetted to the polycrystalline silicon at a jetting rate of 5000 cc/minute for 3 minutes from a jetting nozzle. Next, the basket containing said jetted polycrystalline silicon was immersed in a dissolved ozone aqueous solution of 20 ppm in ozone density stored in a second tub for 5 minutes. Next, this basket was pulled up from the second tub and was immersed for 5 minutes in hydrofluoric acid of 0.5 wt % in density stored in a third tub. Next, this basket was pulled up from the third tub and placed in a fourth tub, and a dissolved ozone aqueous solution of 20 ppm in ozone density was jetted to the polycrystalline silicon at a jetting rate of 5000 cc/minute for 3 minutes from a jetting nozzle. Then this basket was pulled up from the fourth tub and was immersed for 5 minutes in hydrofluoric acid of 0.5 wt % in density stored in a fifth tub. Next, this basket was pulled up from the fifth tub and was immersed for 15 minutes in ultra pure water stored in a sixth tub. Next, this basket was pulled up from the sixth tub and introduced into a hot-air drier, and the polycrystalline silicon was dried and then the dried polycrystalline silicon was taken out from the basket.

The density of iron in this polycrystalline silicon after cleaning was measured by an ICP mass spectrometer and was found to be 1 ppb-wt on the average.

The cleaned polycrystalline silicon of 150 kg was put into a crucible and was molten by a carbon heater to form a molten silicon liquid. A seed crystal was made to come into contact with the molten silicon liquid and grown into a single crystal silicon ingot. The pulled ingot was measured and found to be 110 kg in weight (at a solidification of 0.73) and 1500 mm in pulled length.

The pulled ingot was crushed by a crusher into blocks. The single crystal silicon in the shape of blocks was put into a basket made of polyethylene and this basket was immersed for 30 minutes in acetone stored in a seventh tub. Then, this basket was pulled up from the seventh tub and immersed for 5 minutes in a mixed solution of hydrofluoric acid of 50 wt % in density and nitric acid of 70 wt % stored in an eighth tub. Next, this basket was pulled up from the eighth tub and immersed for 15 minutes in ultra pure water stored in a ninth tub. Then, this basket was pulled up from the ninth tub and was immersed in the eighth tub (mixed acid, 5 minutes), subsequently the ninth tub (ultra pure water, 15 minutes), the eighth tub (mixed acid, 5 minutes), the ninth tub (ultra pure water, 15 minutes). This basket was pulled up from the ninth tub and introduced into a hot-air drier, and the single crystal silicon was dried and then the dried single crystal silicon was taken out from the basket.

The density of iron in the single crystal silicon after cleaning was measured by an ICP mass spectrometer and was found to be 0.05 ppb-wt or less.

The cleaned single crystal silicon of 110 kg was put into a crucible and was molten again (remolten) by a carbon heater to form a molten silicon liquid. A seed crystal was made to come into contact with the molten silicon liquid and grown into a single crystal silicon ingot. Here, the ingot was pulled using the V/G determined so that a domain corresponding to position $P_2$ shown in FIG. 4 was grown over the whole length of the ingot. The pulled ingot was measured and found to be 80 kg in weight (at a solidification of 0.73) and 1100 mm in pulled length.

A silicon wafer was obtained by lapping and beveling and then mirror-polishing a silicon wafer sliced from the ingot pulled in this way. The density of iron of the obtained silicon wafer was measured by a surface photo voltage (SPV) method and found to be about $1 \times 10^9$ atoms/cm$^3$ on the average.

And COP, OSF and L/D being crystal defects in said silicon wafer were measured. As for COP, the silicon wafer was cleaned with a mixed solution of ammonia and hydrogen peroxide and then COPs of 0.12 μm or larger in size on the surface of this wafer were examined using a laser particle counter (SFS6200 manufactured by KLA-Tencor, Inc.). And as for OSF, the silicon wafer was heat-treated at a temperature of 1000° C. for 4 hours and successively heat-treated at a temperature of 1130° C. for 3 hours (pyrogenic oxidation process), and it was examined by eye whether or not an OSF was actualized. Further, as for L/D, the surface of said silicon wafer was chemically etched by a Secco etching solution for 30 minutes. Next, peculiar traces generated by this were observed by means of an optical microscope and existence of transferred traces of L/D on the silicon wafer being a substrate was examined.

As the result, the number of COPs of 0.12 or more in size was zero all over the wafer. And no OSF nor L/D has appeared at all over the whole surface of the wafer.

Embodiment Example 2

Figure 15:
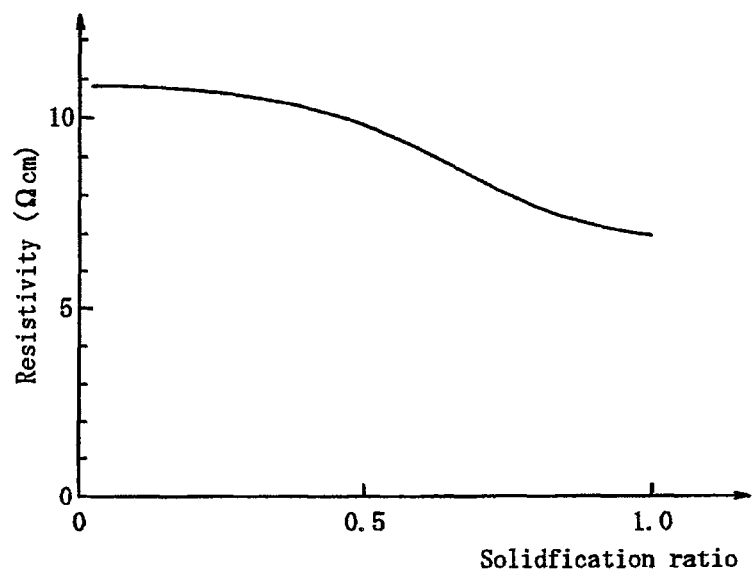
FIG. 15 shows the state where the resistivity varies according to the length of an ingot of embodiment example 2 when the ingot is pulled.

A single crystal silicon ingot was pulled by means of the CCZ method, aiming at a wafer of 10 Ωcm in resistivity, $1.00 \times 10^{18}$ atoms/cm$^3$ in boron density and $0.99 \times 10^{18}$ atoms/cm$^3$ in phosphorus density. High-purity polycrystalline silicon of 20 kg was used as an initial raw material, and metal boron of 1.26 g, silicon dopant of 14.7 g doped with phosphorus and single crystal silicon recharged blocks of 20 kg doped with phosphorus were put into a quartz crucible together with this raw material, and this quartz crucible was heated to melt the raw material and the dopant. And polycrystalline silicon in the shape of grains containing metal boron was gradually supplied to the molten silicon liquid during a pulling operation. This supplied material was 32 kg in total. An ingot of 6 inches in diameter and 900 mm in length of its straight body portion was obtained by being pulled under a condition in which the pulling speed V=0.8 mm/minute equal to embodiment example 1, the temperature gradient G=3.4° C./mm in the center of the ingot, and V/G=0.23 mm$^2$/minute° C. As described above, although the respective segregation coefficients of boron and phosphorus are different from each other, by compensating through additionally supplying a dopant of boron, even when the length of the ingot was made large and close to 1 in solidification ratio as shown in FIG. 15, the resistivity was less in variation in comparison with that at the beginning of pulling.

Comparative Example 1

An ingot was pulled under the same condition as embodiment example 2 except that the pulling speed V was set at 0.9 mm/minute.

Comparative Example 2

With the same target as embodiment example 2, metal boron of 2.20 g, silicon dopant of 25.6 g doped with phosphorus and single crystal silicon recharged blocks of 35 kg doped with phosphorus were put into a quartz crucible, and this quartz crucible was heated to melt the raw material and the dopant. A single crystal silicon ingot was pulled by means of the CZ method under a condition in which the pulling speed V=0.8 mm/minute, the temperature gradient G=3.4° C./mm in the center of the ingot, and V/G=0.23 mm$^2$/minute° C. This pulling condition is nearly equal to a condition in which $D_1/D_0$ shown in FIG. 11 when doping no dopant is 0.9. The pulled ingot was 6 inches in diameter and 600 mm in length of its straight body portion.

Figure 16:
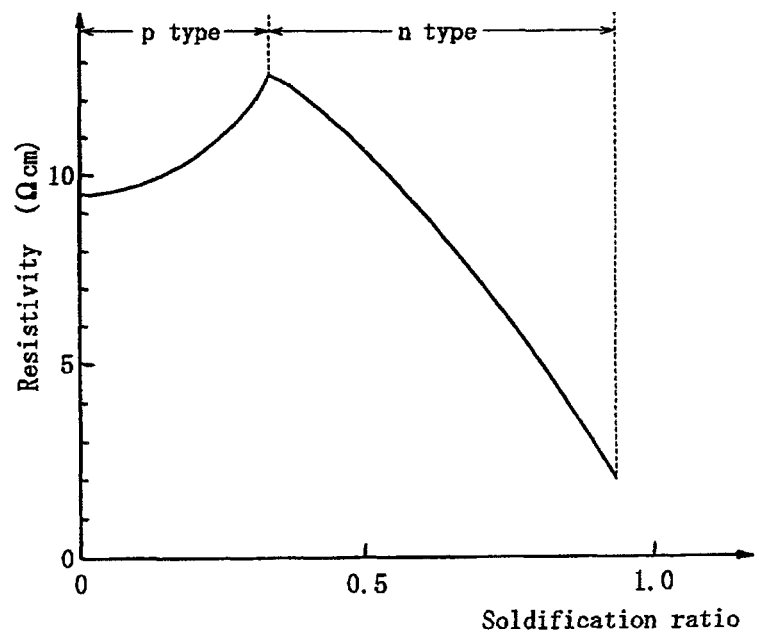
FIG. 16 shows the state where the resistivity varies according to the length of an ingot of comparative example 2 when the ingot is pulled.

Since the segregation coefficient of boron is 0.8 and the segregation coefficient of phosphorus is 0.35, the larger and the more the ingot becomes in length and approximates to 1 in solidification ratio, the more the resistivity varies as shown in FIG. 16, and the conduction type of the ingot has been reversed from the p type to the n type.

Comparative Example 3

An ingot was pulled under the same condition as comparative example 2 except that the pulling speed V was set at 0.9 mm/minute.

Comparative Example 4

Aiming at a wafer of 10 Ωcm in resistivity and $1.00 \times 10^{15}$ atoms/cm$^3$ in boron density, silicon dopant of 1.78 g doped with boron was put into a quartz crucible together with high-purity polycrystalline silicon of 35 kg and this quartz crucible was heated to melt the raw material. An ingot of 6 inches in diameter and 600 mm in length of its straight body portion was obtained by being pulled by means of the CZ method under a condition in which the pulling speed V=0.8 mm/minute equal to embodiment example 2, the temperature gradient G=3.4° C./mm in the center of the ingot, and V/G=0.23 mm$^2$/minute° C.

Comparative Example 5

An ingot was pulled under the same condition as comparative example 4 except that the pulling speed V was set at 0.9 mm/minute.

Comparative Example 6

Aiming at a wafer of 0.02 Ωcm in resistivity and $1.00 \times 10^{18}$ atoms/cm$^3$ in boron density, metal boron of 2.2 g was put into a quartz crucible together with high-purity polycrystalline silicon of 35 kg and this quartz crucible was heated to melt the raw material. An ingot of 6 inches in diameter and 600 mm in length of its straight body portion was obtained by being pulled by means of the CZ method under a condition in which the pulling speed V=0.8 mm/minute equal to embodiment example 2, the temperature gradient G=3.4° C./mm in the center of the ingot, and V/G=0.23 mm$^2$/minute° C.

Comparative Example 7

An ingot was pulled under the same condition as comparative example 6 except that the pulling speed V was set at 0.9 mm/minute.

Comparative Evaluation 1

A silicon wafer sliced from each of ingots of embodiment example 2 and comparative examples 1 to 7 was lapped and beveled and then mirror-polished.

Each of silicon wafers obtained in this way was heat-treated in an oxygen atmosphere at a temperature of 1100° C. for 1 hour, and it was examined whether or not OSF was generated. And after each wafer received a donor killer heat treatment, the resistivity of each silicon wafer was measured by a four terminal resistance measuring method.

Following this, the number of COPs being not smaller than 0.11 μm and not larger than 10 μm in a circle of 144 mm in diameter on the surface of each of the silicon wafers of embodiment example 2 and comparative examples 1 to 7 was examined by means of a laser particle counter (SFS6200 manufactured by KLA-Tencor, Inc.). And each of the silicon wafers of embodiment example 2 and comparative examples 1 to 7 was immersed in a Secco etching solution for 30 minutes without stirring, and existence of a peculiar flow pattern to be generated by this was checked and then existence of FDP and L/D was examined observing existence of etching induced pits by means of an optical microscope.

Further, in a manner similar to a semiconductor device manufacturing process, these silicon wafers were heat-treated at 800° C. for 4 hours and successively at 1000° C. for 16 hours. After the heat treatment, each wafer was cloven and the surface of the wafer was selectively etched by a Wright etching solution for 3 minutes, and BMD from the center of the wafer to the periphery at a depth of 300 μm from the surface of the wafer was measured by observation using an optical microscope and the density of BMD was calculated. The result of these is shown in Table 2.

TABLE 2

|  | Pulling speed (mm/minute) | Radius of OSF ring | Resistivity | Density of COP (COPs/cm$^3$) | Density of FPD (FPDs/cm$^3$) | Density of L/D (L/Ds/cm$^3$) | Density of BMD (BMDs/cm$^3$) |
|---|---|---|---|---|---|---|---|
| Embodiment example 2 | 0.8 | No OSF | 7-11 | 0.02 | ✕ | ✕ | $1 \times 10^{10}$-$1 \times 10^{11}$ |
| Comparative example 1 | 0.9 | 5 | 7-11 | 0.7 | $1 \times 10^5$ | ✕ | $1 \times 10^{10}$-$1 \times 10^{11}$ |
| Comparative example 2 | 0.8 | No OSF | p/n reversed | 0.02 | ✕ | ✕ | $1 \times 10^{10}$-$1 \times 10^{11}$ |
| Comparative example 3 | 0.9 | 5 | p/n reversed | 0.6 | $1 \times 10^5$ | ✕ | $1 \times 10^{10}$-$1 \times 10^{11}$ |
| Comparative example 4 | 0.8 | 40 | 10 | 17 | $25 \times 10^4$ | ✕ | Inside OSF ring: $1 \times 10^{11}$ Outside OSF ring: $1 \times 10^6$ |
| Comparative example 5 | 0.9 | 50 | 10 | 20 | $3 \times 10^5$ | ✕ | Inside OSF ring: $1 \times 10^{11}$ Outside OSF ring: $1 \times 10^6$ |
| Comparative example 6 | 0.8 | No OSF | 0.03 | 0.02 | ✕ | ✕ | $1 \times 10^{10}$-$1 \times 10^{11}$ |
| Comparative example 7 | 0.9 | 5 | 0.03 | 0.7 | $1 \times 10^5$ | ✕ | $1 \times 10^{10}$-$1 \times 10^{11}$ |

In Table 2, a symbol "✕" means "Not more than the lower limit of detection ($1 \times 10^3$ defect agglomerates/cm$^3$)".

As apparently seen from Table 2, in a wafer of embodiment example 2 doped with boron and phosphorus and pulled at a pulling speed of 0.8 mm/minute, no OSF appeared and the density of each of COP, FPD and L/D was substantially zero. Further, this had a BMD density of $1 \times 10^{10}$ to $1 \times 10^{11}$ BMDs/cm$^3$ and was found to have an IG effect. On the other hand, in comparative examples 2 and 3, when the solidification ratio (length of the ingot) exceeded about 0.3, the conduction type was reversed from the p type to the n type. And on wafers of comparative examples 4 and 5, an OSF ring appeared under a heat treatment in an oxidizing atmosphere, and on wafers of comparative examples 1, 3 and 7, a disk-shaped OSF appeared. Attending on this, in comparative examples 1, 3, 4, 5 and 7 except comparative examples 2 and 6, the density of COP is more in comparison with embodiment example 2, and particularly it was found that in wafers of comparative examples 4 and 5, the densities of BMD inside and outside an OSF ring after heat treatment were greatly different from each other and a uniform IG effect could not be obtained over the whole surface of the wafer. Further, in comparative examples 6 and 7, the resistivity was 0.03 Ωcm but was not a desired resistivity of 1 to 15 Ωm.

Embodiment Example 3

Polycrystalline silicon to be raw material to which pure carbon was added was molten and an ingot was pulled from this molten silicon liquid. This pulling operation has been performed so that a domain corresponding to position $P_2$ shown in FIG. 4 covers the whole length of the ingot and V/G shown in FIG. 13 is not smaller than $(V/G)_1$ and not larger than $(V/G)_2$, and domain $[P_V]$/domain $[P_I]$ is about 1 in area ratio. A silicon wafer sliced from the pulled ingot was lapped and beveled, and then damages of the surface of the wafer were removed by a chemical etching process and thereby a mirror-polished silicon wafer was obtained. The density of carbon of the wafer was $1\times10^{15}$ atoms/cm$^3$.

Embodiment Example 4

A mirror-polished wafer was obtained in the same way as embodiment example 3 except that the amount of pure carbon added to polycrystalline silicon to be raw material was made larger than embodiment example 3. The density of carbon of the wafer was $5\times10^{15}$ atoms/cm$^3$.

Embodiment Example 5

After the amount of pure carbon added to polycrystalline silicon to be raw material was made lower than embodiment example 3, an ingot has been pulled so that a domain corresponding to position $P_2$ shown in FIG. 4 covers the whole length of the ingot and V/G shown in FIG. 13 is not smaller than $(V/G)_1$ and not larger than $(V/G)_2$, and domain $[P_V]$/domain $[P_I]$ is about 1 in area ratio. The pulled ingot was processed in the same way as embodiment example 3 and then a polysilicon layer of 0.5 µm in thickness was formed on the back of a wafer at 650° C. using SiH$_4$ by means of a CVD method. After this, a silicon wafer was obtained by mirror-polishing. The density of carbon of the wafer was $5\times10^{14}$ atoms/cm$^3$.

Embodiment Example 6

A mirror-polished wafer was obtained in the same way as embodiment example 5 except that a polysilicon layer on the back of the wafer was made to be 1.0 µm in thickness. The density of carbon of the wafer was $5\times10^{14}$ atoms/cm$^3$.

Embodiment Example 7

A mirror-polished wafer was obtained in the same way as embodiment example 5 except that a polysilicon layer on the back of the wafer was made to be 1.5 µm in thickness. The density of carbon of the wafer was $5\times10^{14}$ atoms/cm$^3$.

Embodiment Example 8

The same amount of pure carbon as embodiment example 3 was added to polycrystalline silicon to be raw material, which has been molten and an ingot has been pulled so that a domain corresponding to position $P_2$ shown in FIG. 4 covers the whole length of the ingot and V/G shown in FIG. 13 is not smaller than $(V/G)_1$ and not larger than $(V/G)_2$, and domain $[P_V]$/domain $[P_I]$ was about 1 in area ratio. The pulled ingot was processed in the same way as embodiment example 3 and then a polysilicon layer of 1.0 µm in thickness was formed at 650° C. using SiH$_4$. After this, a silicon wafer was obtained by mirror-polishing. The density of carbon of the wafer was $1\times10^{15}$ atoms/cm$^3$.

Embodiment Example 9

A mirror-polished wafer was obtained in the same way as embodiment example 8 except that the amount of pure carbon added to polycrystalline silicon to be raw material was made the same as embodiment example 4. The density of carbon of the wafer was $5\times10^{15}$ atoms/cm$^3$.

Embodiment Example 10

A mirror-polished wafer was obtained in the same way as embodiment example 8 except that a polysilicon layer on the back of the wafer was made to be 1.5 µm in thickness. The density of carbon of the wafer was $1\times10^{15}$ atoms/cm$^3$.

Embodiment Example 11

A mirror-polished wafer was obtained in the same way as embodiment example 9 except that a polysilicon layer on the back of the wafer was made to be 1.5 µm in thickness. The density of carbon of the wafer was $5\times10^{15}$ atoms/cm$^3$.

Comparative Example 8

After the amount of pure carbon added to polycrystalline silicon to be raw material was made lower than embodiment example 3, an ingot has been pulled so that a domain corresponding to position $P_2$ shown in FIG. 4 covers the whole length of the ingot and V/G shown in FIG. 13 is not smaller than the critical point and not larger than $(V/G)_2$, and domain [P$V]/domain $[P_I]$ is about 1 in area ratio. A silicon wafer sliced from the pulled ingot was lapped and chamfered, and then damages of the surface of the wafer were removed by a chemical etching process and thereby a mirror-polished silicon wafer was obtained. The density of carbon of the wafer was $5\times10^{14}$ atoms/cm$^3$.

Comparative Example 9

A mirror-polished wafer was obtained in the same way as embodiment example 4 except that the amount of pure carbon added to polycrystalline silicon to be raw material was made larger than embodiment example 4. The density of carbon of the wafer was $1\times10^{16}$ atoms/cm$^3$.

Comparative Example 10

A mirror-polished wafer was obtained in the same way as embodiment example 8 except that the amount of pure carbon added to polycrystalline silicon to be raw material was made larger than embodiment example 8. The density of carbon of the wafer was $1\times10^{16}$ atoms/cm$^3$.

Comparative Example 11

A mirror-polished wafer was obtained in the same way as comparative example 10 except that a polysilicon layer on the back of the wafer was made to be 1.5 μm in thickness.

Comparative Evaluation 2

The density of carbon in each of the wafers of embodiment examples 3 to 11 and comparative examples 8 to 11 was measured by means of a charged particle radioactivation analysis, and the density of oxygen in each of the wafers was measured by means of a Fourier transform infrared spectroscopy (FT-IR). Further, each wafer was heat-treated at 800° C. in an oxygen atmosphere for 4 hours and then was heat-treated at 1000° C. in an oxygen atmosphere for 16 hours. After the heat treatment, each wafer was cloven and the surface of the wafer was selectively etched by a Wright etching solution, and BMD was measured in the center of the wafer and in the vicinity of half the radius of the wafer at a depth of 300 μm from the surface of the wafer by observation using an optical microscope and the density of BMD was calculated. The result of these is shown in Table 3.

As apparently seen from Table 3, after heat treatment of each silicon wafer, in both the center and the vicinity, of half the radius of the wafer, while the density of BMD in the wafers of comparative examples 8, 10 and 11 has not come into a range of $10^8$ to $10^{11}$ BMDs/cm$^3$ in which there is an IG effect, the density of BMD in the wafers of embodiment examples 3 to 11 has come into a range of $10^8$ to $10^{11}$ BMDs/cm$^3$ in which there is an IG effect. The density of BMD in the wafer of comparative example 9 is greatly different between in the center and the vicinity of half the radius of the wafer. A uniform IG effect could not be obtained over the whole surface of wafer of comparative example 9.

What is claimed is:

1. A silicon wafer manufacturing method comprising;
a first cleaning process of cleaning block-shaped or grain-shaped polycrystalline silicon with a dissolved ozone aqueous solution,
a second cleaning process of cleaning the polycrystalline silicon cleaned in the first cleaning process with fluoric acid or mixed acid of fluoric acid and nitric acid,
a process of rinsing the polycrystalline silicon cleaned in the second cleaning process with ultra pure water,
a process of melting the rinsed polycrystalline silicon and pulling a single crystal silicon ingot from the molten silicon liquid at a solidification ratio of 0.9 or less,
a process of making the pulled single crystal silicon ingot into block-shaped or grain-shaped single crystal silicon,
a third cleaning process of cleaning the block-shaped or grain-shaped single crystal silicon with a dissolved ozone aqueous solution,
a fourth cleaning process of cleaning the single crystal silicon cleaned in the third cleaning process with fluoric acid or mixed acid of fluoric acid and nitric acid,
a process of rinsing the single crystal silicon cleaned in the fourth cleaning process with ultra pure water,
a process of remelting the rinsed single crystal silicon and pulling again a single crystal silicon ingot from this molten silicon liquid at a solidification of 0.9 or less as controlling the pulling speed and the temperature gradient so that V/G is a ratio being not smaller than $(V/G)_1$ and not larger than $(V/G)_2$, and
a process of forming a silicon wafer out of said single crystal silicon ingot, wherein
V means a speed (mm/minute) of pulling an ingot from a molten silicon liquid, G means a temperature gradient (° C./mm) in the interface portion between the ingot and

TABLE 3

| | Area ratio | Density of carbon (atoms/cm$^3$) | Density of oxygen (atoms/cm$^3$) | Thickness of polysilicon layer on the back | Density of BMD after heat treatment | |
|---|---|---|---|---|---|---|
| | | | | | Domain [P$_V$] in the center of wafer (BMDs/cm$^3$) | Domain [P$_I$] in R/2 of wafer (BMDs/cm$^3$) |
| Embodiment example 3 | About 1 | $1 \times 10^{15}$ | $1.2 \times 10^{18}$ | 0 | $5.0 \times 10^9$ | $3.3 \times 10^9$ |
| Embodiment example 4 | About 1 | $5 \times 10^{15}$ | $1.2 \times 10^{18}$ | 0 | $2.3 \times 10^{10}$ | $5.0 \times 10^9$ |
| Embodiment example 5 | About 1 | $5 \times 10^{14}$ | $1.2 \times 10^{18}$ | 0.5 | $5.5 \times 10^9$ | $5.0 \times 10^9$ |
| Embodiment example 6 | About 1 | $5 \times 10^{14}$ | $1.2 \times 10^{18}$ | 1.0 | $6.5 \times 10^9$ | $5.5 \times 10^9$ |
| Embodiment example 7 | About 1 | $5 \times 10^{14}$ | $1.2 \times 10^{18}$ | 1.5 | $9.0 \times 10^9$ | $7.5 \times 10^9$ |
| Embodiment example 8 | About 1 | $1 \times 10^{15}$ | $1.2 \times 10^{18}$ | 1.0 | $1.7 \times 10^{10}$ | $1.6 \times 10^{10}$ |
| Embodiment example 9 | About 1 | $5 \times 10^{15}$ | $1.2 \times 10^{18}$ | 1.0 | $3.1 \times 10^{10}$ | $3.0 \times 10^{10}$ |
| Embodiment example 10 | About 1 | $1 \times 10^{15}$ | $1.2 \times 10^{18}$ | 1.5 | $1.8 \times 10^{10}$ | $1.7 \times 10^{10}$ |
| Embodiment example 11 | About 1 | $5 \times 10^{15}$ | $1.2 \times 10^{18}$ | 1.5 | $3.3 \times 10^{10}$ | $3.1 \times 10^{10}$ |
| Comparative example 8 | About 1 | $5 \times 10^{14}$ | $1.2 \times 10^{18}$ | 0 | $3.5 \times 10^9$ | $5.0 \times 10^6$ |
| Comparative example 9 | About 1 | $1 \times 10^{16}$ | $1.2 \times 10^{18}$ | 0 | $6.0 \times 10^{10}$ | $1.0 \times 10^{10}$ |
| Comparative example 10 | About 1 | $1 \times 10^{16}$ | $1.2 \times 10^{18}$ | 1.0 | $1.7 \times 10^{11}$ | $1.6 \times 10^{11}$ |
| Comparative example 11 | About 1 | $1 \times 10^{16}$ | $1.2 \times 10^{18}$ | 1.5 | $2.3 \times 10^{11}$ | $2.2 \times 10^{11}$ | the molten silicon liquid, $(V/G)_1$ means a first critical ratio for preventing occurrence of interstitial silicon point defect agglomerates, and $(V/G)_2$ means a second critical ratio for limiting vacancy point defect agglomerates within a domain in the middle of the ingot where vacancy point defect agglomerates exist dominantly.

* * * * *